United States Patent
Nishimoto

(10) Patent No.: US 8,522,175 B2
(45) Date of Patent: Aug. 27, 2013

(54) SEMICONDUCTOR CIRCUIT DESIGN SUPPORTING APPARATUS AND METHOD, AND NON-TRANSITORY COMPUTER-READABLE MEDIUM

(71) Applicant: Casio Computer Co., Ltd., Tokyo (JP)

(72) Inventor: Masateru Nishimoto, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 13/740,456

(22) Filed: Jan. 14, 2013

(65) Prior Publication Data

US 2013/0185686 A1    Jul. 18, 2013

(30) Foreign Application Priority Data

Jan. 16, 2012    (JP) ................................. 2012-005747

(51) Int. Cl.
 *G06F 17/50* (2006.01)
 *G06F 9/455* (2006.01)
(52) U.S. Cl.
 USPC .......................................... 716/104; 716/108
(58) Field of Classification Search
 USPC ................................................ 716/104, 108
 See application file for complete search history.

(56) References Cited

U.S. PATENT DOCUMENTS

| 6,625,797 B1* | 9/2003 | Edwards et al. ............... 716/103 |
| 7,216,318 B1* | 5/2007 | Siarkowski .................... 716/104 |
| 7,958,470 B1* | 6/2011 | Siarkowski .................... 716/104 |
| 2004/0068711 A1* | 4/2004 | Gupta et al. ..................... 716/18 |
| 2005/0273741 A1* | 12/2005 | Lahner et al. ..................... 716/6 |
| 2008/0059938 A1* | 3/2008 | Kanamaru ....................... 716/18 |
| 2008/0201671 A1* | 8/2008 | Rejouan et al. .................. 716/6 |
| 2010/0064263 A1* | 3/2010 | Rahim et al. ...................... 716/2 |
| 2012/0151425 A1* | 6/2012 | Appleton et al. ............. 716/108 |
| 2012/0216080 A1* | 8/2012 | Bansal et al. ................... 714/45 |

FOREIGN PATENT DOCUMENTS

JP    2003-216672 A    7/2003

* cited by examiner

*Primary Examiner* — Suresh Memula
(74) *Attorney, Agent, or Firm* — Holtz, Holtz, Goodman & Chick, P.C.

(57) ABSTRACT

A semiconductor circuit design supporting method includes: reading Register Transfer Level (RTL) description circuit data; generating an equivalent circuit corresponding to the RTL description circuit data; extracting a plurality of arithmetic components included in the generated equivalent circuit; clustering some of the extracted arithmetic components as a single arithmetic component, wherein no storage element exists between said some of the extracted arithmetic components; reading a timing constraint on the RTL description circuit data; tracing an exception path of the RTL description circuit data when the timing constraint includes a timing exception; determining whether or not the timing exception is set for input pins of said some of the arithmetic components which are clustered as the single arithmetic component, based on the traced exception path of the RTL description circuit data; and separating a arithmetic component for which the timing exception is set, from said some of the arithmetic components which are clustered as the single arithmetic component.

7 Claims, 6 Drawing Sheets

FIG. 3

```
module TEST (
    clk,
    A, B, C,
    Z
);

input       clk ;
input  [ 7:0] A, B, C;
output [23:0] Z;

reg [ 7:0] RegA, RegB, RegC;
reg [31:0] Z;
```

```
always @( posedge clk ) begin
    RegA <= A;
    RegB <= B;
    RegC <= C;
end always @( posedge clk ) begin
    Z <= RegA * RegB * RegC;
end endmodule
```

EXAMPLE OF RTL DESCRIPTION

EQUIVALENT CIRCUIT CORRESPONDING TO
RTL DESCRIPTION CIRCUIT DATA IN FIG. 3

TIMING CHART

CLUSTERED
ARITHMETIC COMPONENTS

CIRCUIT OBTAINED BY SEPARATION OF
CLUSTERED ARITHMETIC COMPONENTS

HARDWARE CONFIGURATION EXAMPLE

SEMICONDUCTOR CIRCUIT DESIGN SUPPORTING APPARATUS AND METHOD, AND NON-TRANSITORY COMPUTER-READABLE MEDIUM

CROSS-REFERENCE TO RELATED APPLICATION

This application claims priority from Japanese Patent Applications No. 2012-005747, filed on Jan. 16, 2011, the entire contents of which are hereby incorporated by reference.

BACKGROUND OF THE INVENTION

1. Field of the Invention

The present invention relates to techniques for supporting design of semiconductor circuits such as LSIs by using computers, and in particular relates to techniques for supporting design of circuits including timing exception paths.

2. Description of the Related Art

In recent years, semiconductor circuits have generally been designed using RTL (Register Transfer Level) descriptions, and logic synthesis tools for performing logic synthesis of circuit data in RTL descriptions to automatically generate gate-level circuits have been utilized (see, for example, JP-A-2003-216672).

For example, an existing logic synthesis tool performs logic synthesis on the basis of the following arithmetic expression:

Expression: $Z = A \times B \times C$

In this case, logic synthesis is performed using the following different timing constraints 1 and 2.

Constraint 1: A, B and C are all "true path"
Constraint 2: A and C are "false path (timing exception)" but B is "true path"

With the existing logic synthesis tool, results of the logic synthesis, performed using Constraints 1 and 2, both have a structure illustrated in FIG. 4 described later, and thus identical logic circuits are generated.

In other words, when logic synthesis is performed on the basis of the above-described computing equation, there is a problem in that the existing logic synthesis tool is incapable of generating a logic circuit in consideration of a timing exception set by a timing constraint.

SUMMARY OF THE INVENTION

It is an illustrative aspect of the present invention to provide a technique for generating a logic circuit in consideration of a timing exception.

According to one or more illustrative aspects of the present invention, there is provided a semiconductor circuit design supporting apparatus. The apparatus includes: means for reading Register Transfer Level (RTL) description circuit data; means for generating an equivalent circuit corresponding to the RTL description circuit data and extracting a plurality of arithmetic components included in the generated equivalent circuit; means for clustering some of the extracted arithmetic components as a single arithmetic component, wherein no storage element exists between said some of the extracted arithmetic components; means for reading a timing constraint on the RTL description circuit data; means for tracing an exception path of the RTL description circuit data when the timing constraint includes a timing exception; means for determining whether or not the timing exception is set for input pins of said some of the arithmetic components which are clustered as the single arithmetic component, based on the traced exception path of the RTL description circuit data; and means for separating a arithmetic component for which the timing exception is set, from said some of the arithmetic components which are clustered as the single arithmetic component.

Semiconductor circuit design supporting apparatus and method according to the present invention are capable of reducing the number of logic steps that have to be performed in one cycle, and capable of reducing an area of a circuit obtained by logic synthesis. In particular, the higher the target frequency, the greater the area reduction effect will be.

BRIEF DESCRIPTION OF THE DRAWINGS

FIG. 3 illustrates exemplary circuit data in an RTL description;

DETAILED DESCRIPTION OF THE PREFERRED EMBODIMENTS

Figure 1:
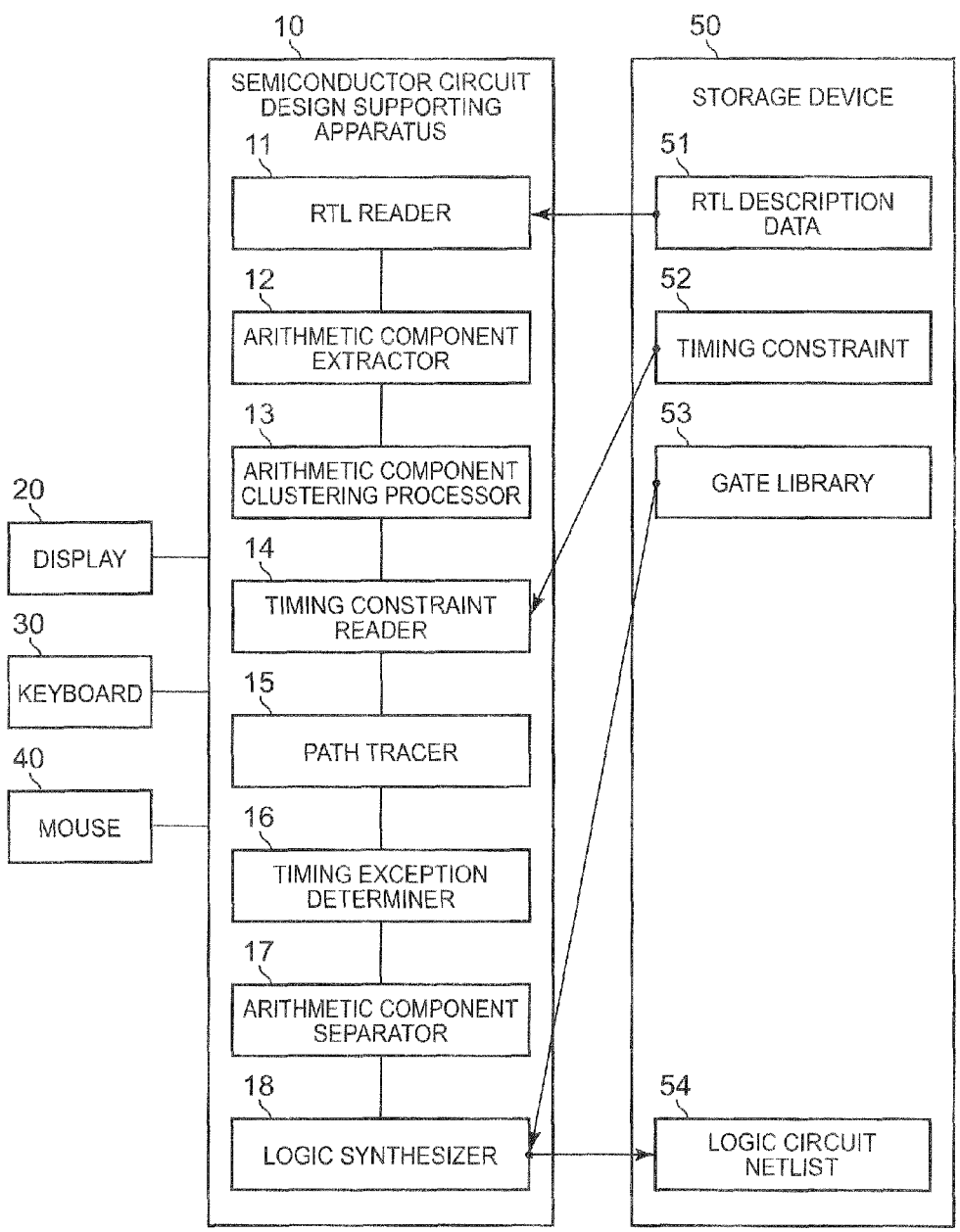
FIG. 1 is a functional block diagram illustrating a semiconductor circuit design supporting apparatus according to one embodiment of the present invention.

FIG. 1 is a functional block diagram illustrating a semiconductor circuit design supporting apparatus according to one embodiment of the present invention. In FIG. 1, "10" represents a semiconductor circuit design supporting apparatus, "20" represents a display, "30" represents a keyboard, "40" represents a mouse, and "50" represents a storage device such as a hard disk. In this embodiment, the semiconductor circuit design supporting apparatus 10 includes: an RTL reader 11; a arithmetic component extractor 12; a arithmetic component clustering processor 13; a timing constraint reader 14; a path tracer 15; a timing exception determiner 16; a arithmetic component separator 17; and a logic synthesizer 18. Furthermore, data stored in the storage device 50 includes: RTL description circuit data 51 serving as a design object; a timing constraint 52; and a gate library 53. The storage device 50 further stores a gate-level logic circuit netlist 54 generated by the logic synthesizer 18.

Figure 2:
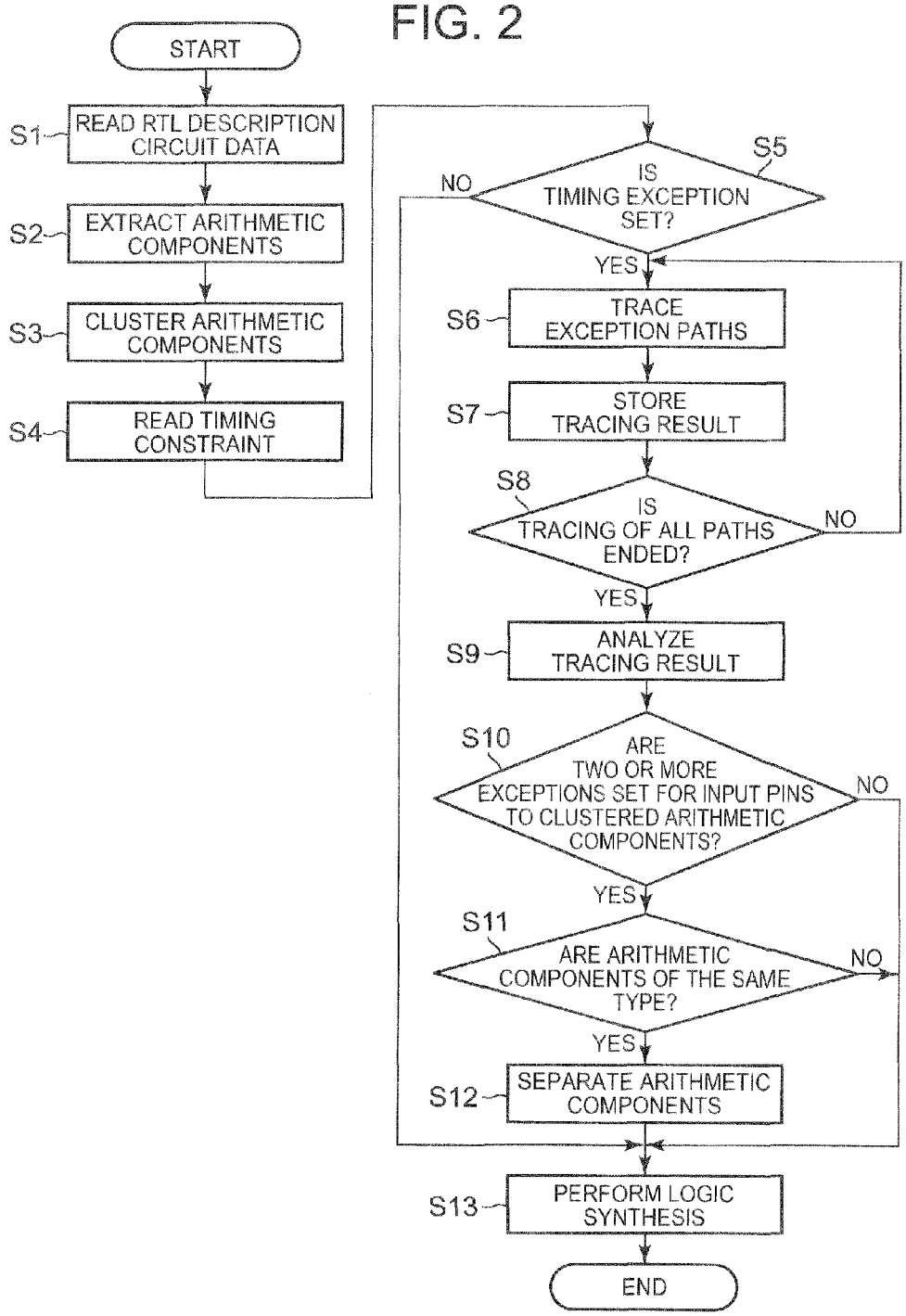
FIG. 2 illustrates an example of flow of processing performed by the semiconductor circuit design supporting apparatus illustrated in FIG. 1.

FIG. 2 illustrates a flow chart of processing performed by the semiconductor circuit design supporting apparatus 10. Steps illustrated in FIG. 2 are associated with processes performed by the constituent elements of the semiconductor circuit design supporting apparatus 10 illustrated in FIG. 1. Specifically, Step S1 is associated with a process performed by the RTL reader 11, Step S2 is associated with a process performed by the arithmetic component extractor 12, Step S3 is associated with a process performed by the arithmetic component clustering processor 13, Step S4 is associated with a process performed by the timing constraint reader 14, Steps S5 to S9 are associated with processes performed by the path tracer 15, Steps S10 and S11 are associated with processes performed by the timing exception determiner 16, Step S12 is associated with a process performed by the arithmetic component separator 17, and Step S13 is associated with a process performed by the logic synthesizer 18.

Note that the present invention may naturally be realized by implementing processing functions of the processing units 11 to 18 of the semiconductor circuit design supporting apparatus 10, illustrated in FIG. 1, partially or entirely by a computer program and by executing the program with the use of a computer. Alternatively, the present invention may naturally be realized by implementing the process flow, illustrated in FIG. 2, similarly by a computer program and by allowing a computer to execute the program.

Hereinafter, operations performed in the embodiment of the present invention will be specifically described with reference to FIGS. 1 and 2. First, the RTL reader 11 reads, from the storage device 50, RTL description circuit data 51 serving as a design object (Step S1). In this embodiment, the RTL description circuit data illustrated in FIG. 3 is read.

Figure 4:
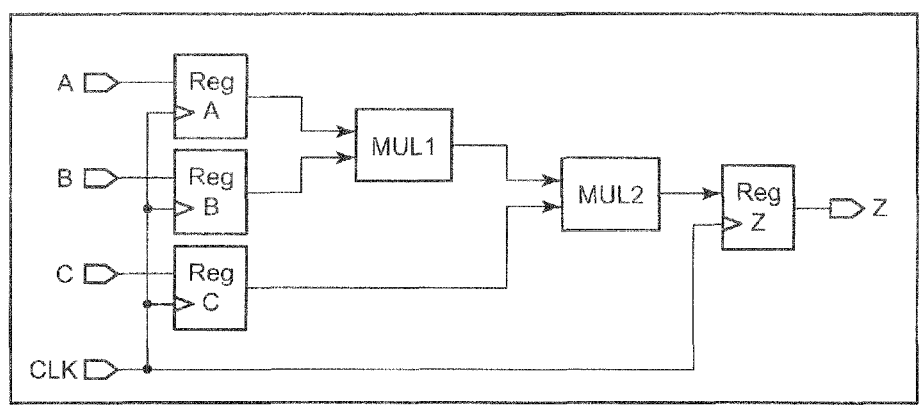
FIG. 4 is a diagram illustrating logic of the RTL description illustrated in FIG. 3.

The arithmetic component extractor 12 is configured to generate an equivalent circuit corresponding to the read RTL description circuit data 51 and extracts arithmetic components included in the generated equivalent circuit (Step S2). FIG. 4 is a diagram illustrating a circuit obtained by logically developing the RTL description circuit data illustrated in FIG. 3. "RegA", "RegB", "RegC" and "RegZ" represent storage elements for temporarily retaining signals, and "MUL1" and "MUL2" represent multipliers for multiplying input signals. When a single expression includes a plurality of calculations as illustrated in the RTL description in FIG. 3, the equivalent circuit is generated from the left of the expression.

Figure 6:
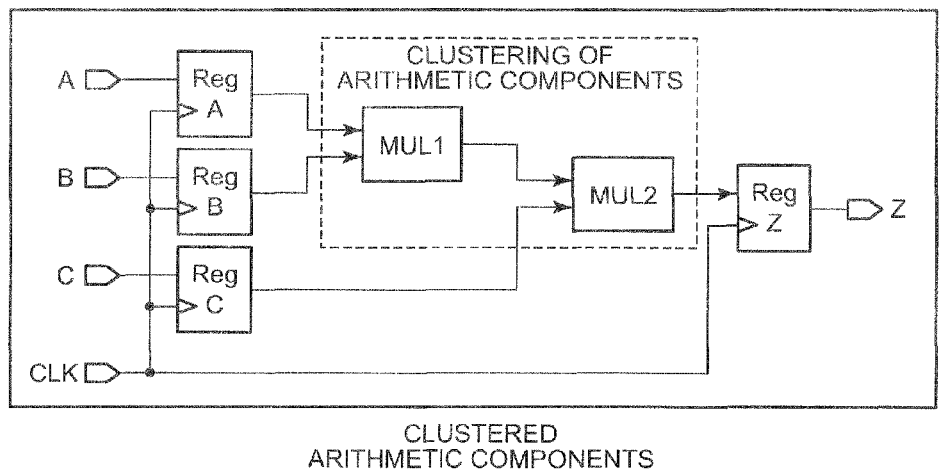
FIG. 6 is a diagram illustrating clustered arithmetic components.

When a plurality of arithmetic components are present with no storage element interposed therebetween, the arithmetic component clustering processor 13 clusters the arithmetic components such that they are operated as a single arithmetic component (Step S3). FIG. 6 is a diagram illustrating how the arithmetic components are clustered, and in this case, the multipliers MUL1 and MUL2 are operated as a single arithmetic component.

Figure 5:
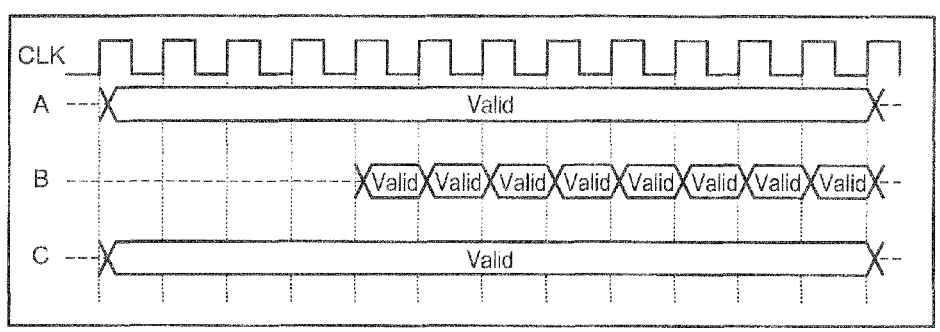
FIG. 5 illustrates an example of a timing chart of the present circuit.

Next, the timing constraint reader 14 reads the timing constraint 52 on the present circuit from the storage device 50 (Step S4). The timing constraint 52 on the present circuit will be described with reference to FIG. 5. FIG. 5 is a timing chart illustrating transition timing of signals A, B and C input to the arithmetic components. From this timing chart, it can be seen that the signals A and C make no transitions for a sufficiently long period of time with respect to a clock CLK, and thus do not change even while the signal B repeatedly makes transitions. On the other hand, it can be seen that the signal B starts to change for each cycle from a given time period. Due to such signal specifications, the signals A and C are each set for a "false path (timing exception)". In other words, a path leading from the storage element RegA to the storage element RegZ and a path leading from the storage element RegC to the storage element RegZ are each set as a path through which the signal does not have to be propagated in each cycle, while the signal has to be propagated in each cycle through a path leading from the storage element RegB to the storage element RegZ.

The path tracer 15 analyzes the timing constraint 52 read by the timing constraint reader 14, and determines whether or not a timing exception is set (Step S5). In this example, a timing exception is set for each of the signals A and C (YES in Step S5), and therefore, the path tracer 15 traces exception paths (Step S6). First, the signal A passes through the clustered arithmetic components from the storage element RegA and reaches the storage element RegZ. Hence, information indicating that a timing exception is set for the path leading from the storage element RegA to the storage element RegZ through the clustered arithmetic components is stored (Step S7). Next, similarly to the signal A, the signal C passes through the clustered arithmetic component from the storage element RegC and reaches the storage element RegZ; therefore, information indicating that a timing exception is set for the path leading from the storage element RegC to the storage element RegZ through the clustered arithmetic component is stored (Step S7).

When all exception paths have been traced (YES in Step S8), the timing exception determiner 16 analyzes the information stored as timing exceptions (Step S9), and determines whether or not two or more timing exceptions are set for input pins to the clustered arithmetic components (Step S10). In this example, two timing exceptions are set (YES in Step S10), and therefore, the timing exception determiner 16 then determines whether or not the input pins, for which the timing exceptions are set, are provided to the arithmetic components of the same type (Step S11).

Figure 7:
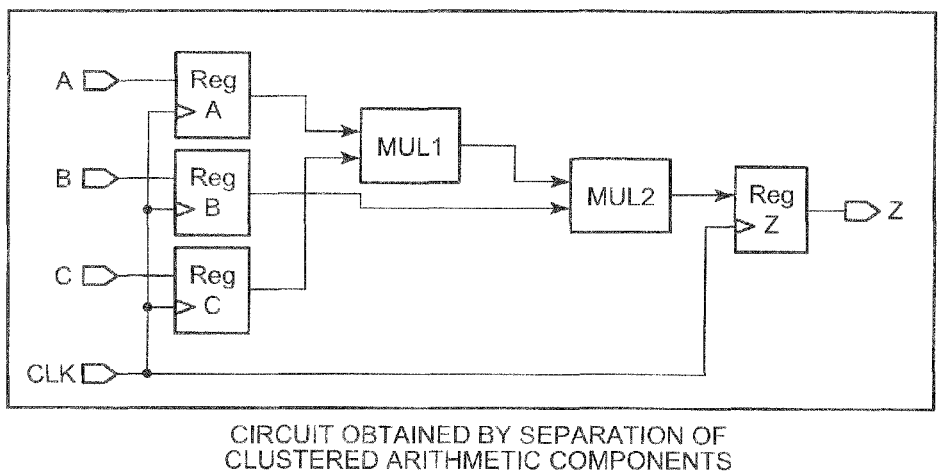
FIG. 7 is a diagram illustrating a circuit obtained by separation of the clustered arithmetic components.

In this example, the input pins, for which the timing exceptions are set, are provided to the arithmetic components of the same type, i.e., the multipliers (YES in Step S11). Hence, the arithmetic component separator 17 achieves separation between: the arithmetic component of the path for which the timing exception is set; and the arithmetic component of the path for which no timing exception is set, thus individually allocating the arithmetic components (Step S12). In the present embodiment, a logic circuit illustrated in FIG. 7 is obtained. The arithmetic components are allocated as described above; thus, it can be seen that the number of logic steps, which are included in the path leading from the storage element RegB to the storage element RegZ and have to be performed in one cycle, is reduced as compared with the circuit illustrated in FIG. 4.

After the arithmetic components have been allocated as described above, the logic synthesizer 18 performs logic synthesis, and stores the logic circuit netlist 54 in the storage device 50 (Step S13).

Then, using the logic circuit netlist, Place & Route, for example, is performed; however, these operations are not directly related to the present invention, and therefore, description thereof will be omitted.

Figure 8:
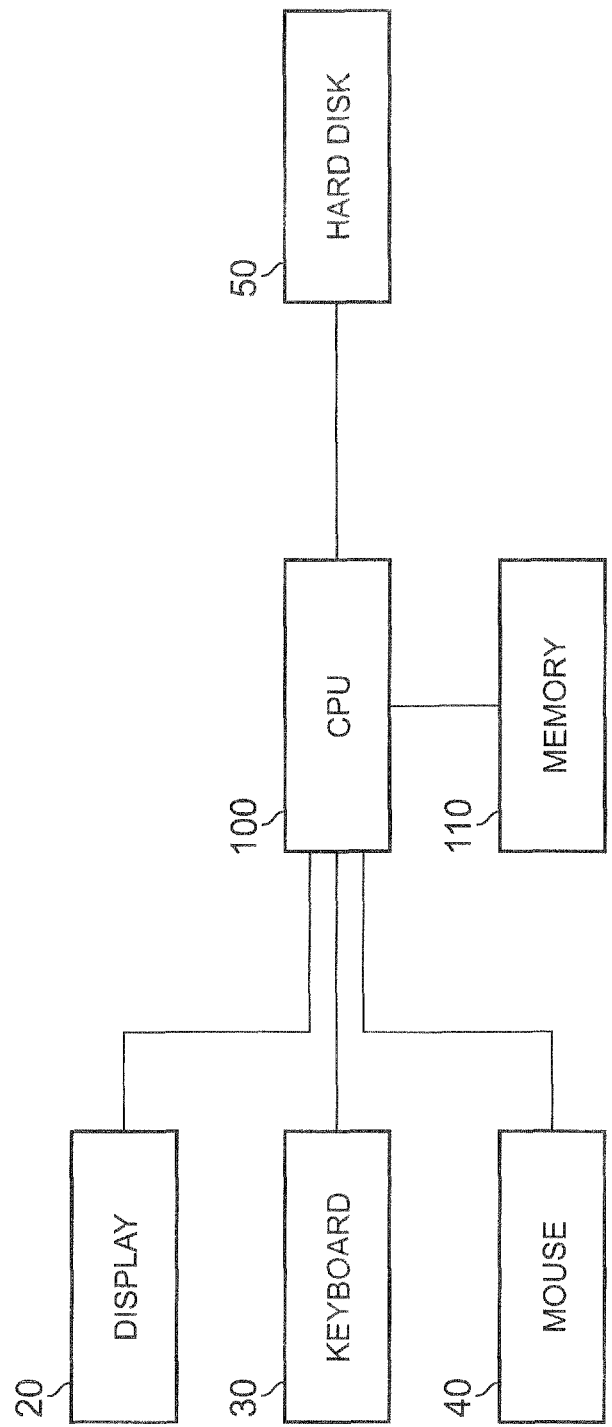
FIG. 8 is a diagram illustrating an example of a hardware configuration of a computer system according to the present invention.

FIG. 8 illustrates an example of a configuration of a computer system to which the present invention is applied. In addition to data such as the RTL description circuit data, timing constraint and gate library, the hard disk 50 stores processing functions of the processing units 11 to 18 of the semiconductor circuit design supporting apparatus 10 illustrated in FIG. 1, which are provided as a computer program. A CPU 100 reads the program from the hard disk 50 into a memory 110 and executes the read program, thus allowing the semiconductor circuit design supporting apparatus 10, illustrated in FIG. 1, to perform processes such as: reading of RTL description circuit data; extraction of arithmetic components; clustering of arithmetic components; reading of a timing constraint; tracing of paths; determination of timing exceptions; separation of arithmetic components; and logic synthesis. In this case, the memory 110 is used as a working memory. A designer issues an operation instruction by using the keyboard 30 and/or the mouse 40, and a result is presented on the display 20.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A semiconductor circuit design supporting apparatus comprising:
   means for reading Register Transfer Level (RTL) description circuit data;
   means for generating an equivalent circuit corresponding to the RTL description circuit data and extracting a plurality of arithmetic components included in the generated equivalent circuit;
   means for clustering some of the extracted arithmetic components as a single arithmetic component, wherein no storage element exists between said some of the extracted arithmetic components;
   means for reading a timing constraint on the RTL description circuit data;
   means for tracing an exception path of the RTL description circuit data when the timing constraint includes a timing exception;
   means for determining whether or not the timing exception is set for input pins of said some of the arithmetic components which are clustered as the single arithmetic component, based on the traced exception path of the RTL description circuit data; and
   means for separating a arithmetic component for which the timing exception is set, from said some of the arithmetic components which are clustered as the single arithmetic component.

2. The apparatus according to claim 1, further comprising:
   means for separating the arithmetic component for which the timing exception is set, from said some of the arithmetic components which are clustered as the single arithmetic component so as to generate a gate-level circuit based on the RTL description circuit data, when two or more timing exceptions are set for the input pins of said some of the arithmetic components which are clustered as the single arithmetic component, and said input pins of said some of the arithmetic components are connected to the same type arithmetic component.

3. A semiconductor circuit design supporting method comprising:
   reading Register Transfer Level (RTL) description circuit data;
   generating an equivalent circuit corresponding to the RTL description circuit data;
   extracting a plurality of arithmetic components included in the generated equivalent circuit;
   clustering some of the extracted arithmetic components as a single arithmetic component, wherein no storage element exists between said some of the extracted arithmetic components;
   reading a timing constraint on the RTL description circuit data;
   tracing an exception path of the RTL description circuit data when the timing constraint includes a timing exception;
   determining whether or not the timing exception is set for input pins of said some of the arithmetic components which are clustered as the single arithmetic component, based on the traced exception path of the RTL description circuit data; and
   separating a arithmetic component for which the timing exception is set, from said some of the arithmetic components which are clustered as the single arithmetic component.

4. The method according to claim 3, further comprising:
   separating the arithmetic component for which the timing exception is set, from said some of the arithmetic components which are clustered as the single arithmetic component so as to generate a gate-level circuit based on the RTL description circuit data, when two or more timing exceptions are set for the input pins of said some of the arithmetic components which are clustered as the single arithmetic component, and said input pins of said some of the arithmetic components are connected to the same type arithmetic component.

5. A non-transitory computer-readable medium storing a program for causing a computer to execute operations comprising:
   reading Register Transfer Level (RTL) description circuit data;
   generating an equivalent circuit corresponding to the RTL description circuit data;
   extracting a plurality of arithmetic components included in the generated equivalent circuit;
   clustering some of the extracted arithmetic components as a single arithmetic component, wherein no storage element exists between said some of the extracted arithmetic components;
   reading a timing constraint on the RTL description circuit data;
   tracing an exception path of the RTL description circuit data when the timing constraint includes a timing exception;
   determining whether or not the timing exception is set for input pins of said some of the arithmetic components which are clustered as the single arithmetic component, based on the traced exception path of the RTL description circuit data; and
   separating a arithmetic component for which the timing exception is set, from said some of the arithmetic components which are clustered as the single arithmetic component.

6. The computer-readable medium according to claim 5, the operations further comprising:
   separating the arithmetic component for which the timing exception is set, from said some of the arithmetic components which are clustered as the single arithmetic component so as to generate a gate-level circuit based on the RTL description circuit data, when two or more timing exceptions are set for the input pins of said some of the arithmetic components which are clustered as the single arithmetic component, and said input pins of said some of the arithmetic components are connected to the same type arithmetic component.

7. A semiconductor circuit design supporting apparatus
   a processor; and
   a memory storing computer program that, when executed by the processor, causes the semiconductor circuit design supporting apparatus to perform operations comprising:
   reading Register Transfer Level (RTL) description circuit data;
   generating an equivalent circuit corresponding to the RTL description circuit data;
   extracting a plurality of arithmetic components included in the generated equivalent circuit;

clustering some of the extracted arithmetic components as a single arithmetic component, wherein no storage element exists between said some of the extracted arithmetic components;

reading a timing constraint on the RTL description circuit data;

tracing an exception path of the RTL description circuit data when the timing constraint includes a timing exception;

determining whether or not the timing exception is set for input pins of said some of the arithmetic components which are clustered as the single arithmetic component, based on the traced exception path of the RTL description circuit data; and separating a arithmetic component for which the timing exception is set, from said some of the arithmetic components which are clustered as the single arithmetic component.

* * * * *